United States Patent [19]
Jain et al.

[11] Patent Number: 5,436,410
[45] Date of Patent: Jul. 25, 1995

[54] METHOD AND STRUCTURE FOR SUPPRESSING STRESS-INDUCED DEFECTS IN INTEGRATED CIRCUIT CONDUCTIVE LINES

[75] Inventors: Vivek Jain, Milpitas; Dipankar Pramanik, Cupertino, both of Calif.

[73] Assignee: VLSI Technology, Inc., San Jose, Calif.

[21] Appl. No.: 243,505

[22] Filed: May 16, 1994

Related U.S. Application Data

[63] Continuation of Ser. No. 902,182, Jun. 22, 1992, Pat. No. 5,332,868.

[51] Int. Cl.⁶ ............................................. H05K 1/00
[52] U.S. Cl. ................................. 174/256; 174/250; 174/258; 428/901
[58] Field of Search ............... 174/266, 256, 258, 250; 428/901

[56] References Cited

U.S. PATENT DOCUMENTS

| | | |
|---|---|---|
| 4,960,613 | 10/1990 | Cole et al. |
| 4,988,423 | 1/1991 | Yamamoto et al. |
| 5,066,612 | 11/1991 | Ohba et al. |
| 5,180,689 | 1/1993 | Liu et al. ............................. 437/228 |

OTHER PUBLICATIONS

Sauter et al., "Finite Element Calculations of Thermal Stresses in Passivated and Unpassived Lines Bonded to Substrates," Mat. Res. Soc. Sym. Proc., vol. 188, Material Research Society, 1990.
Tanikawa, A., "Al Diffusion into Glass Films Used for the Passivation of Fine Al Metallization," Journal of the Electrochemical Society, vol. 138, No. 10, Oct. 1991, pp. 3047–3049.

Primary Examiner—Leo P. Picard
Assistant Examiner—Cheryl R. Figlin
Attorney, Agent, or Firm—Hickman & Beyer

[57] ABSTRACT

A method for reducing defects in an integrated circuit conductive lines characterized by the steps of providing a conductive line and contacting the conductive line with a layer which reduces stress in the line. There are several mechanisms by which the layer can accomplish the desired stress reduction. One method provides a resilient passivation layer over the conductive line and another method provides a resilient layer beneath the line. Yet another method creates a thin, flexible oxide layer over the conductive line. An extension of this latter method provides a resilient buffer layer over the thin oxide layer and a thick oxide layer over the resilient layer. Another form of stress-reducing layer includes an anti-diffusion layer which reduces the diffusion of metal atoms of the conductive layer into the surrounding oxide. A conductive line structure of the present invention includes at least one conductive line and at least one layer contacting the conductive line which reduces stress in the line. The layer can comprise a resilient layer formed over or beneath the conductive line, or it can include a thin oxide layer disposed over the line. Optionally, the thin oxide layer can be covered with a resilient layer and a thick oxide layer. The layer can also comprise an anti-diffusion layer to reduce diffusion-induced stresses in the conductive line.

25 Claims, 4 Drawing Sheets

METHOD AND STRUCTURE FOR SUPPRESSING STRESS-INDUCED DEFECTS IN INTEGRATED CIRCUIT CONDUCTIVE LINES

This is a continuation of application Ser. No. 07/902,182 filed on Jun. 22, 1992, now U.S. Pat. No. 5,332,868.

BACKGROUND OF THE INVENTION

This invention relates generally to integrated circuit manufacture, and more particularly to the fabrication of conductive lines in integrated circuits.

Integrated circuits are formed on a semiconductor substrates such as silicon, germanium, or gallium-arsenide wafers. Active regions of the integrated circuits are formed in the semiconductor wafer itself. For example, the drain, source and channel of a metal-oxide field effect transistor (MOSFET) is formed in the surface of a semiconductor wafer. Active regions are coupled together and to various input and output pads by conductive lines formed over, but insulated from, the surface of the semiconductor wafer.

With reference to prior art FIG. 1a, after the active regions of the semiconductor wafer 10 have been formed, an insulating base oxide layer 12 is deposited over the surface of the wafer. Via holes (not shown) are etched through the oxide layer to provide a means for contacting the active regions of the wafer. Next, a "metallization" layer is deposited over the oxide layer and within the via holes. This metallization layer, which is typically aluminum (Al) or tungsten (W) is then etched to form conductive lines (such as a conductive line 14) between selected active regions of the wafer. Passivation or intermetal oxide, hereinafter referred to as a "passivation layer" is subsequently formed over the conductive line.

When the width of a conductive line becomes sufficiently small, e.g. approximately 2 microns, stress induced defects such as voids start to appear within the body of the conductive line. The origin of thermal stresses in conductive lines is discussed in the article "Finite Element Calculations of Thermal Stresses in Passivated and Unpassivated Lines Bonded to Substrates" by Sauter et al, Mat. Res. Soc. Syrup. Proc., Vol. 188, Material Research Society, 1990. These stresses are generated when the conductive lines are heated and then cooled while being constrained by the base oxide layer 12, or by both the base layer 12 and the passivation layer 16. For example, when a passivation layer 16 is deposited over a conductive line 14 by a chemical vapor deposition (CVD) process, the conductive line 14 is at 300°–400° C. during deposition and is then cooled to ambient temperatures after deposition.

With additional reference to FIG. 1b, even prior to the deposition of the passivation layer 16 the conductive line 14 is firmly adhered to the top of oxide layer 12 and the base of the conductive line is restrained from moving in an x-y plane. Heating and cooling results in the generation of tensile and compressive stresses in the conductive line. As seen in exaggerated detail in FIG. 1c, these stresses may result in bumps 17 during the heating of the line and defects such as voids 18 and faults 20 when the line is cooled.

This condition is worsened by the deposition of the passivation layer 16 over the conductive line 14. Now, the conductive line is not only constrained in the x-y plane, but is also constrained in the z direction as well. In consequence, the conductive line 14 is 3-dimensionally constrained, which can cause substantial internal stresses as the line is heated and cooled.

The problem of stress-induced defects becomes critical in sub-micron geometries. A conductive line with a great number of voids and other defects can break or can exhibit an unacceptably high resistance. Furthermore, stress-induced defects can exacerbate failures due to electromigration, i.e. due to the movement of atoms within the conductive line caused by, and in the direction of, electron flow. The electromigration effect can remove atoms from certain defect areas within the line, leading to premature failure of the conductive line at the defect areas.

Stress is also created by the diffusion of atoms of the conductive line into the surrounding oxide. Again, if sufficient numbers of atoms diffuse away from the conductive line, stress-induced defects such as voids can appear within the body of the conductive line. Stress-induced defects caused by diffusion are becoming more problematical as line widths continue to decrease. A discussion of this phenomenon can be found in a paper entitled "Al Diffusion into Glass Films Used for the Passivation of Fine Al Metallization" by A. Tanikawa, Journal of the Electrochemical Society, Volume 138, No. 10, October 1991, pp. 3047–3049.

SUMMARY OF THE INVENTION

The present invention includes both methods and structures for reducing stress-induced defects in integrated circuit conductive lines. Fewer defects in the conductive lines result in greater device reliability and a longer operating life for the integrated circuit device.

The method of the present invention includes the steps of providing a conductive line and then contacting the line with a layer which reduces the stress within the conductive line. The layer can accomplish the stress reduction in a number of fashions. In a first embodiment, a layer having a low Young's Elastic Modulus is applied over the conductive line to permit the line to expand and contract. In a second embodiment, the thickness of the passivating oxide layer is reduced to increase the flexure of the oxide layer, thereby relieving stress in the conductive line. In a third embodiment, a layer with a low Young's Elastic Modulus is provided beneath the conductive line. In a fourth embodiment, a thin oxide layer is first provided over the conductive line, then a resilient buffer layer is provided over the thin oxide layer, and then a thick oxide layer is provided over the buffer layer. This fourth embodiment relieves stress in the conductive line while still providing a passivation layer with superior characteristics. A fifth embodiment reduces stress in the conductive line by covering the line with an anti-diffusion layer, thereby reducing diffusion into adjacent passivation oxide.

A conductive line structure in accordance with the present invention includes at least one conductive line, and at least one layer contacting the conductive line which reduces stress in the conductive line. One type of structure includes a resilient layer preferably made from an organic dielectric material or a spin-on-glass material. The resilient layer can be disposed beneath the line, over the line, or both. Another type of structure has a thin passivation oxide layer formed over the conductive line which is sufficiently resilient to relieve stress in the conductive line. The thin oxide layer may be covered by a resilient buffer layer and then a thicker oxide layer. A still further structure in accordance with the present invention includes an anti-diffusion layer formed over the conductive line to reduce the diffusion of atoms from the line into adjacent oxide.

Since the conductive lines are less stressed, less defects such as voids and faults are produced within the body of the lines. This results in increased reliability of the integrated circuit device. Furthermore, the integrated circuit device has a longer life-time because the deleterious effects of electromigration is considerably reduced.

These and other advantages of the present invention will become apparent to those skilled in the art upon a reading of the following specification of the invention and a study of the several figures of the drawing.

BRIEF DESCRIPTION OF THE DRAWINGS

FIG. 1b is a perspective view of a portion of the prior an conductive line shown in FIG. 1a;

DETAILED DESCRIPTION OF THE PREFERRED EMBODIMENTS

Figure 1A:
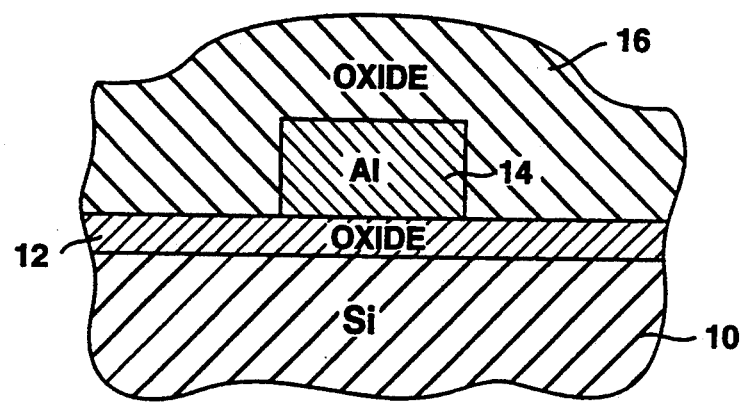
FIG. 1a is a cross-section of a prior an conductive line covered by an oxide layer.
Figure 1B:
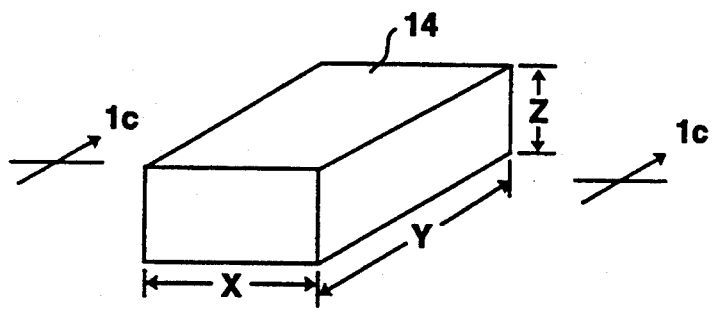
Figure 1C:
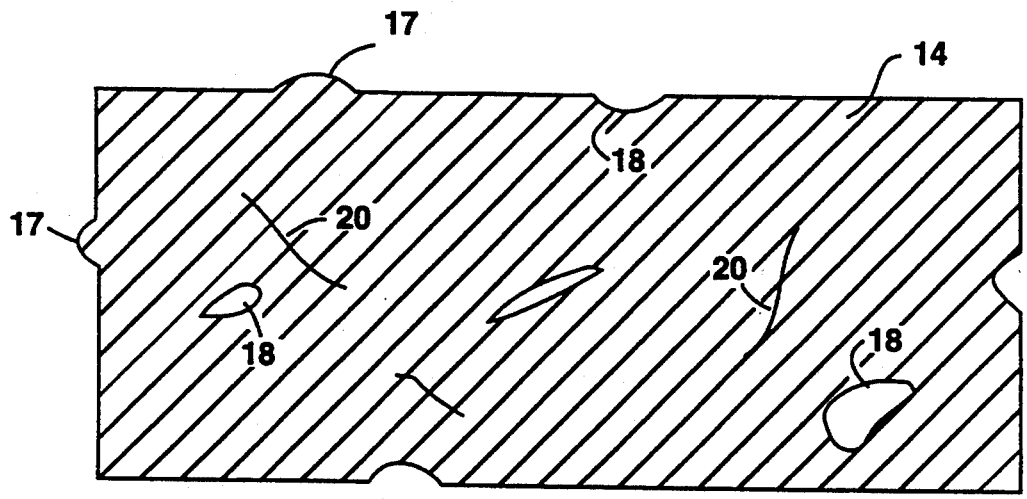
FIG. 1c is a cross-section of the prior an conductive line taken along line 1c—1c of FIG. 1b illustrating stress-induced voids and defects in the line.
Figure 2:
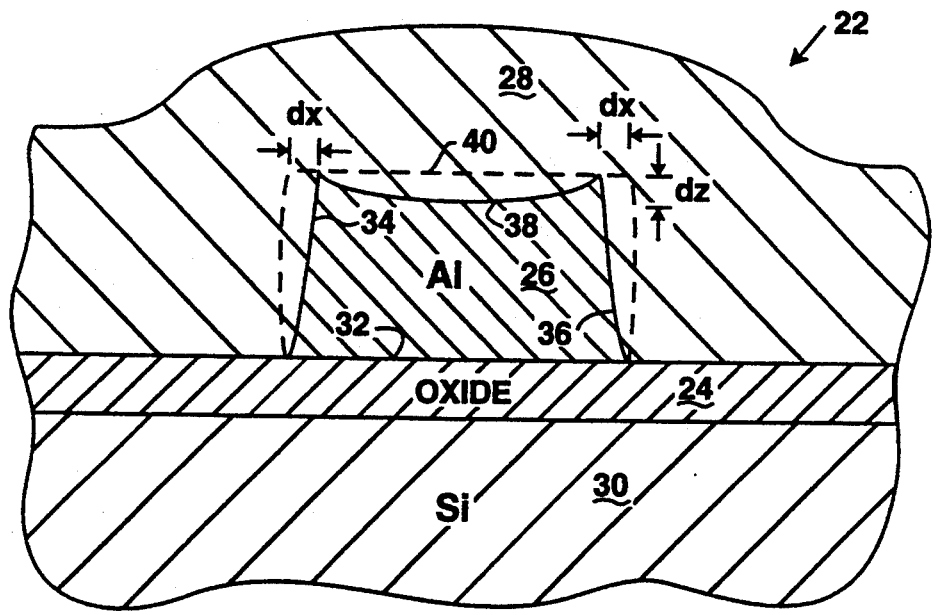
FIG. 2 is a cross sectional view of a first structure in accordance with the present invention which reduces voids and defects in an conductive line.

FIGS. 1a–1c are used to illustrate the state of the prior art. In FIG. 2, a structure 22 is shown including an insulating layer 24, a conductive line 26, and a passivation layer 28. The structure 22 is formed over a suitable substrate, such as a silicon (Si) wafer 30.

The insulating layer 24 is preferably an oxide of silicon formed over the silicon wafer 30 by a suitable process such as a chemical vapor deposition (CVD) process. The conductive line 26 is preferably an aluminum line fabricated by depositing an aluminum (Al) layer over the insulating layer 24 and patterning the aluminum layer by photolithography and etch processes, as is well known to those skilled in the art. The conductive line can also be a multi-layer conductive structure (e.g. Ti, TiW, TiN alternated with Al or Al alloys) and can also be made from other suitable conductive materials such as copper (Cu). As will be discussed in greater detail subsequently, the conductive line 26 is substantially free of voids and other defects.

The passivation layer 28, unlike passivation layers of the prior art, is made from a resilient material having a relatively low Young's Elastic Modulus. Preferably, the Young's Elastic Modulus is less than about 20 Giga-Pascal (GPa) as compared to a Young's Elastic Modulus of about 70 GPa for an oxide of silicon such as silicon dioxide ($SiO_2$). Even more preferably, the Young's Elastic Modulus is less than 10 GPa and most preferably it is below 5 GPa to provide optimal results. The low Young's Elastic Modulus passivation layer 28 relieves stress in the conductive line 26, thereby reducing the number of internal defects (such as voids or faults) formed within the line 26 as it is heated and then cooled.

With continuing reference to FIG. 2, the bottom surface 32 of line 26 rigidly adheres to the relatively inflexible oxide layer 24 while side surfaces 34 and 36 and top surface 38 adhere to the relatively flexible passivation layer 28. As line 26 is heated in the manufacturing process, its volume expands as shown in broken lines at 40. As the line 26 cools, the flexible layer 28 permits the top surface 38 to sag a distance dz from the expanded position 40, and allows the side walls to slant inwardly by a distance dx from the expanded position 40. Similar contraction is permitted in the y direction. By permitting the line 26 to contract, stresses are minimized within the line and defects, such as voids and faults, are greatly reduced.

A preferred material for layer 28 is an organic dielectric polyimide applied by a spin coating process. Organic dielectric polyimides are commercially available from such companies as Hitachi of Japan and E.I. DuPont of New Jersey. The polyimide is spun coated to a thickness of about 1–3 microns, and then is baked at 100°–200° C. for about two minutes. The polyimide is cured at 400° C. for about one hour to produce a layer having a Young's Elastic Modulus less than about 5 GPa.

Another preferred material for layer 28 is a siloxane spin on glass (SOG). Siloxane SOG is a mixture of organics and inorganics having a Young's Elastic Modulus less than about 10 GPa when fully cured. Siloxane SOG liquid can be purchase from companies such as Allied Chemicals of Milpitas, Calif. and Tokyo Ohka Kogyo of Japan. A wafer 30 having the oxide layer 24 and line 26 formed thereupon is placed upon the turntable of a spin coating apparatus. Liquid SOG is dispensed for 2–3 seconds, and then the wafer 30 is spun at approximately 2000–3000 rotations per minute (RPM) for approximately 20 seconds. After being coated, the wafer 30 is removed from the spin coating apparatus and is placed upon a hot plate for curing. A typically curing cycle includes 2 minutes at 100° C., 2 minutes at 200° C., and 2 minutes at 250° C. The wafer is then furnace cured at 400° C. for 30–45 minutes. The spin-coating process can be repeated, as desired, for planarization. For example, a 1000–2000 angstrom layer of siloxane SOG can be applied as a first part of layer 28, and a similar thickness of siloxane SOG can be applied as a second pan of layer 28. The layer 28 can be covered with a 0.5 micron layer (not shown) of PECVD or CVD oxide as a substantially impermeable capping layer.

Yet another material for layer 28 is a borosilicate glass, which can be applied by well-known techniques. Also, other soft oxides formed with a network modifier such as sodium, lithium, magnesium, phosphorous, etc. can be substituted for the borosilicate glass, as is well known to those skilled in the art. A problem with soft oxides is that they absorbs water, which can damage the integrated circuit device being formed. This problem can be minimized by providing an oxide layer (not shown) over the soft oxide layer approximately 0.5 microns thick to serve as a moisture barrier.

Figure 3:
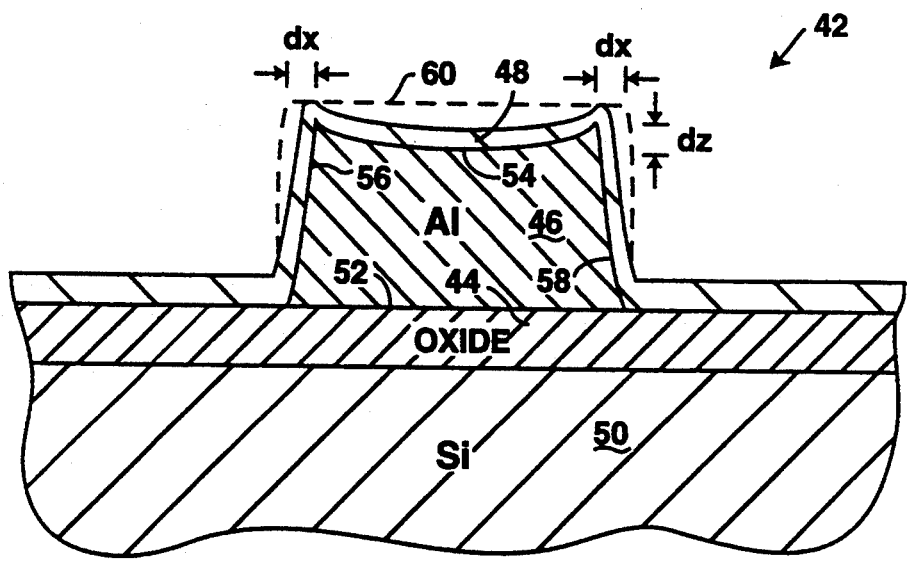
FIG. 3 is a cross sectional view of a second structure in accordance with the present invention which reduces voids and defects in an conductive line.

FIG. 3 illustrates an alternative structure 42 in accordance with the present invention including an oxide base layer 44, a conductive line 46, and a thin passivation layer 48. The structure 42 is preferably formed over a silicon substrate 50. A bottom surface 52 of line 46 adheres to the top surface of layer 44, and the top surface 54 and side surfaces 56 and 58 adhere to the thin layer 48. When heated in the range of 300°–400° C., the line 46 expands as indicated in broken lines at 60. When subsequently cooled, the line 46 is allowed to contract by the relatively flexible, thin passivation layer 48. This contraction causes the top surface 54 to sag a distance dz, and permits the side surfaces 56 and 58 to slant inwardly by a distance dx. Similar contraction takes place in the y direction. As before, by permitting the line 46 to contract, stresses within the line are minimized, thereby minimizing the formation of stress induced defects.

The thin oxide layer 48 is no thicker than 0.4 microns and is preferably no thicker than 0.3 microns. The oxide layer can be deposited by a number of conventional processes, such as plasma-enhanced CVD. Furthermore, it is possible to provide a layer 48 which is thinner on the top surface 54 than on the side surfaces 56 and 58, and vice versa. Such an arrangement provides flexibility where it is desired and provides a more impervious passivation layer where flexibility is not required. The layer 48 can be thinned over the top surface 54 by an anisotropic etching process. Thee side surface 56 and 58 can be male thinner by cocontrolling the deposition chemistry and parameters of the CVD process.

Figure 4:
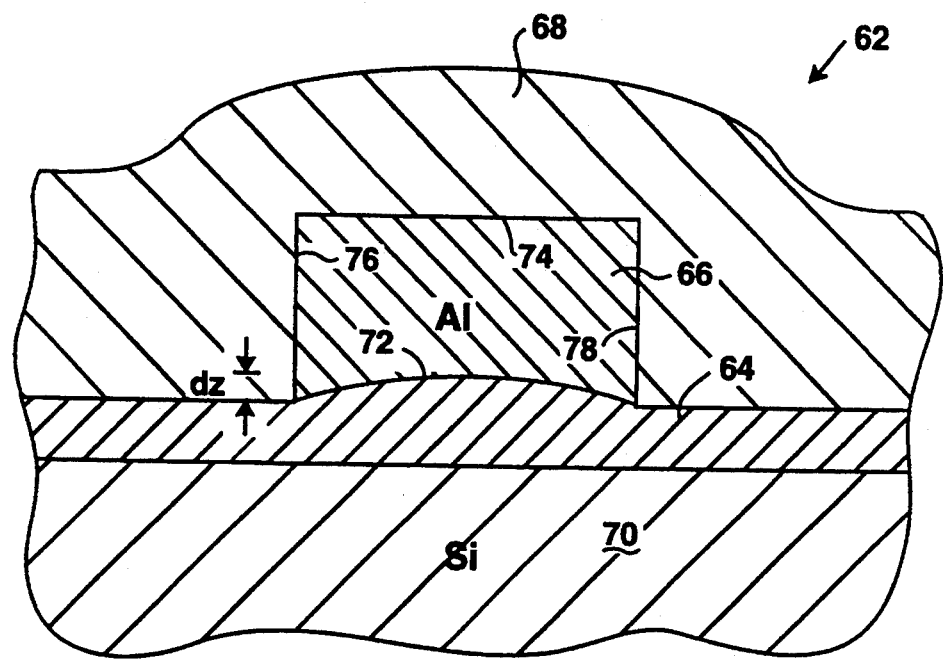
FIG. 4 is a cross sectional view of a third structure in accordance with the present invention which reduces voids and defects in an conductive line.

FIG. 4 illustrates another structure 62 in accordance with the present invention. The structure includes a flexible base layer 64, a conductive line 66, and a thick oxide passivation layer 68. The structure 62 is preferably formed over a silicon substrate 70. The structure 62 differs from the previously described structures in that the base layer, rather than the passivation layer, is flexible. Of course, the structure 62 can be combined with the previously described structures so that both the base layer and the passivation layers are flexible.

With structure 62, a bottom surface 72 adheres to the layer 64, while top surface 74 and side surfaces 76 and 78 adhere to the layer 68. Since thick oxide layer 68 is relatively inflexible, the lines 66 cannot contract from the surfaces 74, 76, and 78 after being heated and then subsequently cooled. However, since base layer 72 is flexible, the bottom surface 72 can contract a distance dz, as shown. This contraction relieves stress in the line 66 and reduces the formation of internal defects.

The base layer 64 is preferably an organic dielectric polyimide applied by a spin coating process or a siloxane spin-on-glass (SOG), also applied by spin coating. Processes for applying polyimide and SOG have been described previously. Preferably, the thickness of base layer 64 is approximately 1 micron. The conductive line 66 and oxide passivation layer 68 are applied in conventional manners. For a conductive line 66, the oxide passivation layer is approximately 1 micron.

Figure 5:
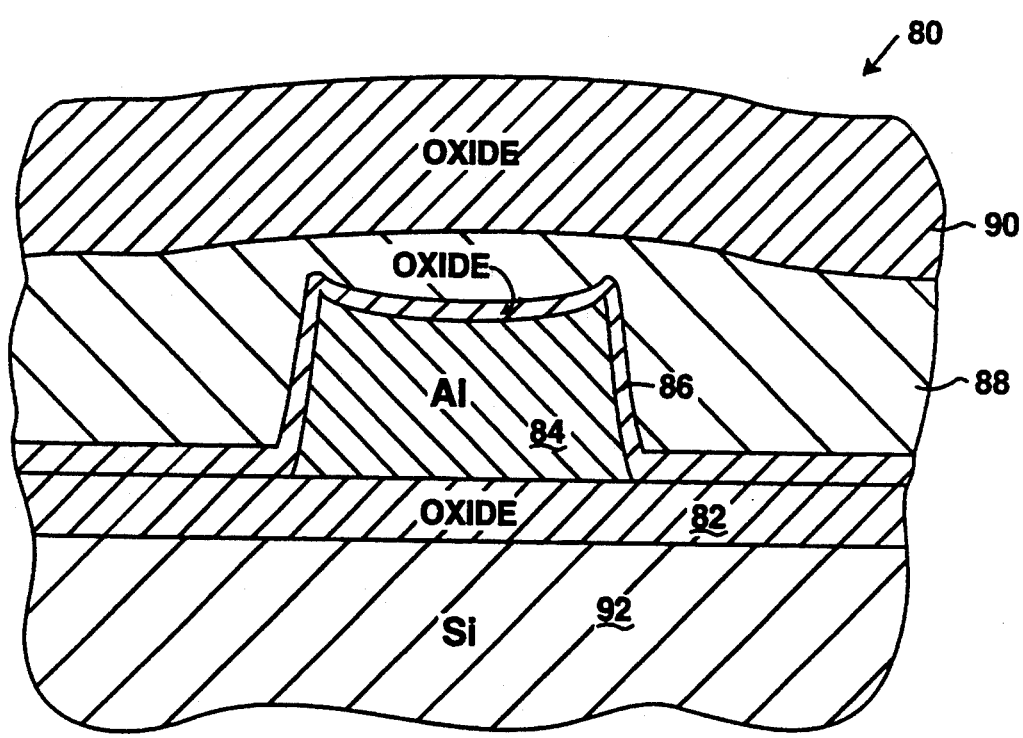
FIG. 5 is a cross sectional view of a fourth structure in accordance with the present invention which reduces voids and defects in an conductive line.

FIG. 5 illustrates a structure 80 in accordance with the present invention which is an extension of structure 42 of FIG. 3. Structure 80 includes an oxide base layer 82, an aluminum conductive line 84, a thin oxide layer 86, a buffer layer 88, and a thick oxide layer 90. The structure is preferably formed over a silicon substrate 92.

The thin oxide layer 86 is formed in the same manner as the thin oxide passivation layer 48 described previously, and operates in the same way to relieve stresses in line 84. However, it has been found that a thin passivation layer 86 of approximately 0.2 microns in thickness does not provide a desired level of passivation for all applications. Layers 88 and 90 are added to enhance the passivation while still providing stress relief to line 84. Therefore, in structure 86, layers 86, 88, and 90 are a multi-layered sandwich which comprise the passivation layer for this embodiment.

Buffer layer 88 is preferably an organic dielectric polyimide applied by a spin coating process or a siloxane spin-on-glass (SOG), also applied by spin coating. Processes for applying polyimide and SOG have been described previously. A preferred thickness for buffer layer 88 when applied over a conductive line 84 is approximately 0.2 microns as measured on a flat wafer. Layer 90 is preferably a plasma CVD oxide deposited to a thickness of about 0.5 microns.

The combination of a thin oxide layer 86 and the flexible buffer layer 88 allows the aluminum conductive line 84 to expand and contract without producing excessive stresses within the line. The thick oxide layer 90 contributes to a substantially impermeable passivation layer to protect the line 84 and other devices of the integrated circuit being manufactured.

Figure 6:
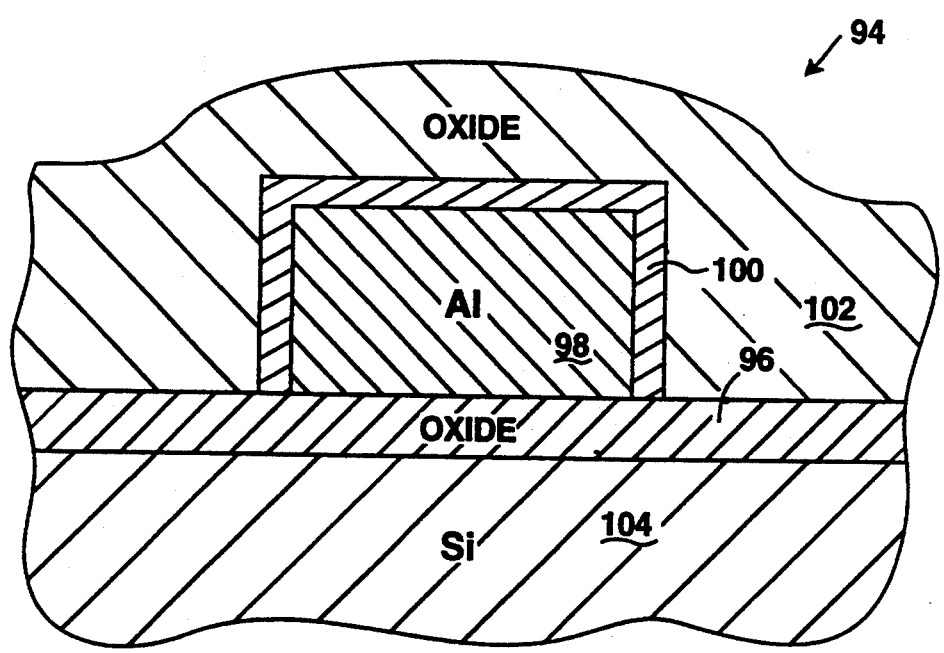
FIG. 6 is a cross sectional view of a fifth structure in accordance with the present invention which reduces voids and defects in an conductive line.

FIG. 6 illustrates another structure 94 in accordance with the present invention. The structure 94 includes an oxide base layer 96, an aluminum conductive line 98, an anti-diffusion layer 100, and a passivation layer 102. The structure 94 is preferably formed over a silicon substrate 104.

A number of materials are suitable for the anti-diffusion layer 100. For example, a 200 angstrom thick layer of aluminum oxide will serve as an excellent anti-diffusion layer. Other suitable materials are tungsten (W) and titanium-tungsten (TiW) alloys applied to a similar thickness. The passivation layer 102 is preferably a plasma CVD oxide deposited to a thickness of about 0.5 microns.

The anti-diffusion layer 100 reduces the number of atoms of the aluminum conductive line 98 which diffuse into the surrounding oxide layer 102. Absent the anti-diffusion layer, a substantial quantity of aluminum atoms can diffuse into the surrounding oxide, creating stresses in the line 98 which can cause internal defects. Therefore, the anti-diffusion layer 100 serves to reduce stress in the conductive line 98.

The structure 94 is produced by first providing the base layer 96 and conductive line 98 by conventional processes. Next, the substrate is heated to about 400° C. in an oxidizing, ambient furnace or rapid thermal processing (RTP) chamber for about 1–2 minutes to create a 200 angstrom thick layer of aluminum oxide ($Al_2O_3$) on line 98. Alternatively, a layer of refractory metal such as W or TiW can be applied in a conventional manner to the conductive line 98 to a thickness of 0.02–0.04 microns. For example, tungsten can be applied selectively upon the conductive line by heating the substrate 104 in a hydrogen reducing ambient at 400°–450° C. using $H_2$ and $WF_6$ as process gasses. Alternatively, the refractory metal can be sputtered onto the substrate in a metal sputtering apparatus at temperatures of about 100° C.–200° C.

All of the previously described structures and processes reduce stress in a conductive line by contacting the line with a stress-reduction layer. This stress reduction reduces defects within the line, thereby reducing the formation of voids and faults within the line. The relative absence of voids and faults prevents a substantial increase in the resistance of the line and reduces the chance that a line will fail. The relative absence of voids and faults also reduces the electromigration failure where atoms of the conductive lines are caused to drift in the direction of electron flow. The reduction of defects by the structures and processes of the present invention increases the electromigration lifetime of a aluminum conductive line by nearly an order of magnitude.

While this invention has been described in terms of several preferred embodiments, it is contemplated that alterations, modifications and permutations thereof will become apparent to those skilled in the an upon a reading of the specification and study of the drawings. It is therefore intended that the following appended claims include all such alterations, modifications and permutations as fall within the true spirit and scope of the present invention.

What is claimed is:

1. A method for reducing defects in an integrated circuit conductive line comprising:

providing a conductive line; and contacting said conductive line with a layer having a Young's Elastic Modulus less than about 20 GPa which reduces stress in said conductive line.

2. A method for reducing defects as recited in claim 1 wherein said layer comprises an organic dielectric material.

3. A method for reducing defects as recited in claim 2 wherein said organic dielectric material comprises a polyimide.

4. A method for reducing defects as recited in claim 1 wherein said layer is provided over said conductive line.

5. A method for reducing defects as recited in claim 1 wherein said layer is provided beneath said conductive line.

6. A method for reducing defects as recited in claim 4 wherein said layer comprises a dielectric layer having an average thickness no greater than 0.4 microns.

7. A method for reducing defects as recited in claim 6 wherein said dielectric layer comprises an oxide of silicon.

8. A method for reducing defects as recited in claim 6 wherein no portion said layer which contacts an upper surface of said conductive line is thicker than 0.4 microns.

9. A method for reducing defects as recited in claim 6 further comprising the step of:

providing a buffer layer over said dielectric layer.

10. A method for reducing defects as recited in claim 9 further comprising the step of:

providing a second dielectric layer over said buffer layer.

11. A method for reducing defects as recited in claim 9 wherein said buffer layer has a Young's Elastic Modulus less than 20 GPa.

12. A method for reducing defects as recited in claim 1 wherein said layer comprises an anti-diffusion layer selected from the group consisting essentially of tungsten, titanium-tungsten, and aluminum oxide.

13. A method for reducing defects as recited in claim 12 further comprising the step of:

providing a dielectric layer over said anti-diffusion layer.

14. A conductive line structure for integrated circuits comprising:

at least one conductive line; and
    at least one layer having a Young's Elastic Modulus less than about 20 GPa contacting said conductive line which reduces stress in said conductive line.

15. A conductive line structure as recited in claim 14 wherein said layer comprises an organic dielectric material.

16. A conductive line structure as recited in claim 14 wherein said layer is disposed over said conductive line.

17. A conductive line structure as recited in claim 14 wherein said layer is provided beneath said conductive line.

18. A conductive line structure as recited in claim 16 wherein said layer comprises a dielectric layer having an average thickness no greater than 0.4 microns.

19. A conductive line structure as recited in claim 18 wherein no portion of said dielectric layer which is in contact with an upper surface of said conductive line is thicker than 0.4 microns.

20. A conductive line structure as recited in claim 18 further comprising a buffer layer disposed over said dielectric layer.

21. A conductive line structure as recited in claim 20 wherein said buffer layer has a Young's Elastic Modulus less than 20 GPa.

22. A conductive line structure as recited in claim 21 further comprising a second dielectric layer disposed over said buffer layer.

23. A conductive line structure as recited in claim 14 wherein said layer comprises and anti-diffusion layer selected from the group consisting essentially of tungsten, titanium-tungsten, and aluminum oxide.

24. A conductive line structure as recited in claim 23 further comprising a dielectric layer disposed over said anti-diffusion layer.

25. A conductive line structure as recited in claim 15 wherein said organic dielectric material comprises a polyimide.

* * * * *